July 10, 1962 J. C. MIDKIFF 3,044,024

ELECTRONIC OSCILLATOR WITH SATURATION BIAS FOR STARTING AND GRID CURRENT BIAS FOR RUNNING

Filed Feb. 19, 1960

INVENTOR.
JAMES C. MIDKIFF.
BY Alden D. Redfield
Charles M. Hogan
ATTORNEYS.

3,044,024

ELECTRONIC OSCILLATOR WITH SATURATION BIAS FOR STARTING AND GRID CURRENT BIAS FOR RUNNING

James C. Midkiff, Cincinnati, Ohio, assignor to Avco Corporation, Cincinnati, Ohio, a corporation of Delaware Filed Feb. 19, 1960, Ser. No. 9,938
3 Claims. (Cl. 331—62)

The present invention relates to oscillators generally and particularly to an illustrative crystal-controlled Colpitts-type oscillator which is novel in that the invention provides an improvement which greatly enhances service life.

The principal object of the invention is to provide an oscillator which is biased for high-current conduction for starting and in which the bias is automatically shifted into a stable lower transconductance region for running.

Figure 1:
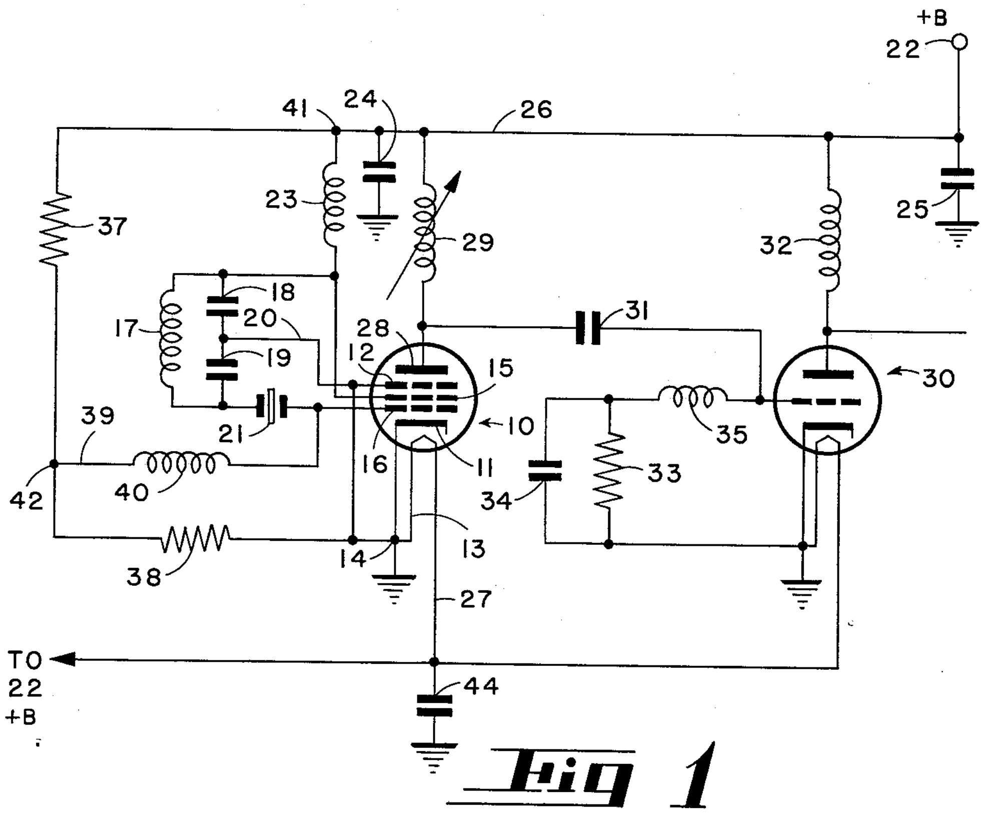
Figure 2:
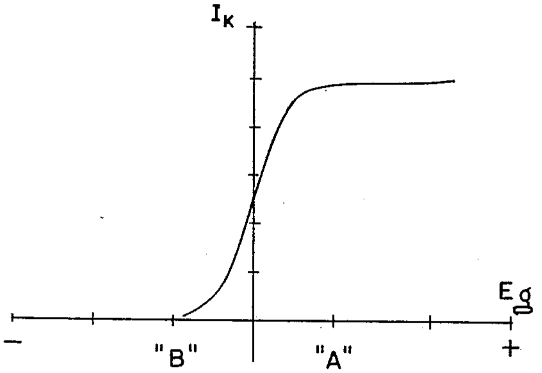

For a better understanding of the present invention, together with other and further objects, advantages and capabilities thereof, reference is made to the immediately-following discussion of the problem which it solves, and then to the description of the appended drawings, in which:

FIG. 1 is a circuit schematic of a high frequency sine wave generator incorporating improved automatic switching circuitry in accordance with the invention, and FIG. 2 is a grid voltage-plate current characteristic curve showing the regions for starting and continuous operation of the oscillator in accordance with the invention.

A requirement of the military was for a stable oscillator producing a characteristic sine wave output of relatively constant amplitude on the order of 117.5 megacycles. The tubes employed in this development were of the class illustrated by type 5907 and operating within a range of 16 to 32 volts on heater, screen grid and plate. Miniature 26 volt type tubes in this category are per se poor in characteristics important to good oscillator performance and tube life is degraded by low power supply voltages and high frequency operation. Therefore, it was found that the tubes in wave generators employing such oscillators were extremely difficult to maintain in service under low voltage drive conditions.

The present invention represents a solution to this problem. It recognizes that starting conditions, originating with noise and similar agitation, depend upon stage gain, so that it is desirable to bias the oscillator to high current production for dependable starting. While recognizing this, the invention involves the further concept that, once started, the bias should automatically be made to shift into a lower conductance region in such a way that the system performs in a manner analogous to a class C amplifier. Based on this concept, the invention provides switching means for accomplishing this shift automatically.

Referring now to FIG. 1, there is shown a high frequency wave generator comprising an oscillator stage and an amplifying and frequency-doubling stage. The oscillator comprises a pentode tube 10 having its cathode 11, suppressor grid 12, and one lead 13 of its filament grounded at 14. The oscillator is electron-coupled to the load so that the screen grid 15 functions effectively as the oscillator plate. Connected between the effective plate 15 and control electrode 16 is the tank circuit of a Colpitts-type oscillator, comprising an inductance 17 and voltage dividing capacitors 18 and 19, each capacitor having one terminal grounded by conductor 20. A piezo-electric crystal 21 is inserted in the grid circuit for purposes of frequency stabilization and operation as a grid capacitor.

The oscillator plate is connected to the positive terminal 22 of a plate supply source (at 27.5 volts, for example) via a radio-frequency choke 23, capacitors 24 and 25 being shunted across the plate supply line 26 for by-pass purposes.

The ungrounded lead 27 of the filament is also connected to 27.5 volt terminal 22.

The oscillator tube anode 28 is connected to supply line 26 via an inductance 29, that inductance and stray capacitance being tuned to twice the frequency of crystal 21 for doubling purposes. The stage including tube 10 functions as an oscillator and amplifier. The circuit elements between cathode 11 and grid 16 are utilized to tune out the reactive components of the amplifying stage. That is to say, choke 40 resonates with the input capacitance to make the amplifier input function as a high resistance rather than a variable reactance depending on the gain of the stage. The circuit to which the output of tube 10 is coupled is only environmental to the present invention and does not constitute any limitation thereon. The particular wave generator for which the invention was developed included a frequency doubling and amplifying stage comprising a tube 30. Anode 28 is coupled to the grid of this doubling stage by a capacitor 31. The grid of this stage is self-biased by a grid leak 33-capacitor 34 combination connected in series with radio frequency choke 35 between grid and the grounded cathode of tube 30. The tube 30 filament is energized in a manner similar to tube 10.

The automatic bias shifting network in accordance with the invention comprises a voltage dividing network between the effective oscillator plate circuit and cathode or ground, which network consists of resistors 37 and 38, together with a direct-current connection 39 to the oscillator grid 16. Interposed in that connection is a choke 40, which isolates crystal 21 from ground.

In an illustrative circuit in accordance with the invention, the voltage at grid 16 upon starting of the oscillator was 0.4 volt. The voltage shifted to 0 volts upon establishment of running conditions.

Referring now to FIG. 2, the bias conditions are as indicated at A for starting. That is, the tube is initially biased into the saturation region. Then as oscillations build up the control electrode is biased to a region such as by B by reason of grid current flow. The grid current flow, in other words, provides a bias opposing the bias produced by the network 37, 38, 39. This shifting action occurs with considerable independence of power supply voltage, so that a wide range of such voltage is permissible.

The wave generator here employed utilized a pentode in the oscillator but the bias-shift principle here disclosed is also of utility with tetrodes and triodes.

While I do not wish to be limited to particular parameters, the following were found suitable in one successful embodiment of the invention:

| | |
|---|---|
| Resistor **37** | 5600 ohms. |
| Resistor **38** | 100 ohms. |
| Chokes **40** and **23** | 2.8 microhenries. |
| Capacitor **18** | 5 microfarads. |
| Capacitor **19** | 15 microfarads. |
| Capacitor **34** | 1000 microfarads. |
| Choke **35** | 2.8 microhenries. |
| Capacitor **24** | 1000 microfarads. |
| Crystal **21** | 117.5 megacycles. |
| Filter capacitor **44** | 1000 microfarads. |
| Voltage at point **22** | 27.5 volts. |
| Tube **10** | Type 5907. |
| Tube **30** | Type 5904. |

While there has been shown and described what is at present considered to be the preferred embodiment of the invention, it will be understood by those skilled in the art that various modifications and changes may be made therein without departing from the true scope of the invention as defined in the appended claims.

I claim:

1. An electron-coupled oscillator comprising a vacuum tube having a grounded cathode and inner control grid and plate and screen grid electrodes, a Colpitts-arranged tank circuit comprising the parallel combination of an inductance and voltage-dividing capacitors between said screen grid and said control grid, said combination having an end terminal connected to the screen grid and an end terminal in circuit with the control grid, means including a source of positive potential and a radio-frequency choke for supplying space current to said screen grid, a piezoelectric control crystal for coupling said combination to said control grid to provide frequency stabilization, a voltage-dividing resistor network connected between the high potential side of said choke and said cathode, and a direct current connection from said network to said control grid to impose thereon a starting bias which is opposed by the bias produced by grid-current rectification as the oscillator assumes running conditions, said connection including a radio-frequency choke, the oscillator starting at high transconductance and running in a manner analogous to a Class-C amplifier.

2. An electron-coupled oscillator comprising a vacuum tube having a grounded cathode and inner control grid and plate and screen grid electrodes, a Colpitts-arranged tank circuit comprising the parallel combination of an inductance and voltage-dividing capacitors between said screen grid and said control grid, said combination having an end terminal connected to the screen grid and an end terminal in circuit with the control grid, means including a source of positive potential and a radio-frequency choke for supplying space current to said screen grid, capacitance means for coupling said combination to said control grid, a voltage-dividing resistor network connected between the high potential side of said choke and said cathode, and a direct current connection from said network to said control grid to impose thereon a starting bias which is opposed by the bias produced by grid-current rectification as the oscillator assumes running conditions, said connection including a radio-frequency choke, the oscillator starting at high transconductance and running in a manner analogous to a Class-C amplifier.

3. In a self-biased free-running oscillator of the feedback type having a tank circuit and including a vacuum tube having at least a cathode, an inner control grid electrode positioned near to the cathode, and a plate, the combination of: means including a voltage divider for producing a positive bias, choke means connected to said divider for applying that positive bias to said control grid, and capacitance between said control grid and said tank circuit, said capacitance and a portion of said divider providing the self bias for sustaining oscillations, said self bias being negative and overcoming the effect of said positive bias when oscillations have started.

References Cited in the file of this patent

UNITED STATES PATENTS

| | | |
|---|---|---|
| 2,155,649 | George | Apr. 25, 1939 |
| 2,479,180 | Norrman | Aug. 16, 1949 |
| 2,543,456 | Grisdale | Feb. 27, 1951 |
| 2,626,354 | Cheek | Jan. 20, 1953 |